(12) United States Patent
Domansky et al.

(10) Patent No.: US 6,383,466 B1
(45) Date of Patent: May 7, 2002

(54) METHOD OF DEHYDROXYLATING A HYDROXYLATED MATERIAL AND METHOD OF MAKING A MESOPOROUS FILM

(75) Inventors: Karel Domansky, Richland; Glen E. Fryxell, Kennewick; Jun Liu, West Richland; Nathan J. Kohler, Richland; Suresh Baskaran, Kennewick, all of WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/222,569

(22) Filed: Dec. 28, 1998

(51) Int. Cl.$^7$ .......................................... C01B 33/159
(52) U.S. Cl. ...................... 423/335; 516/100; 516/111
(58) Field of Search ................... 438/781, 790; 427/220, 255.14, 255.26; 423/335; 516/100, 111

(56) References Cited

U.S. PATENT DOCUMENTS

| | | | |
|---|---|---|---|
| 4,913,966 A | 4/1990 | Garvey | |
| 5,057,296 A | 10/1991 | Beck | |
| 5,098,684 A | 3/1992 | Kresge | |
| 5,102,643 A | 4/1992 | Kresge | |
| 5,104,515 A | 4/1992 | Chu | 208/46 |
| 5,108,725 A | 4/1992 | Beck | |
| 5,112,589 A | 5/1992 | Johnson | 423/328 |
| 5,145,816 A | 9/1992 | Beck | 502/68 |
| 5,156,829 A | 10/1992 | McCullen | 423/718 |
| 5,198,203 A | 3/1993 | Kresge | 423/718 |
| 5,211,934 A | 5/1993 | Kresge | 423/706 |
| 5,215,737 A | 6/1993 | Chu | 423/706 |
| 5,238,676 A | 8/1993 | Roth | 423/713 |
| 5,250,282 A | 10/1993 | Kresge | 423/705 |
| 5,256,277 A | 10/1993 | DelRossi | 208/138 |
| 5,264,203 A | 11/1993 | Beck | 423/703 |
| 5,300,277 A | 4/1994 | Kresge | 423/703 |
| 5,321,102 A | 6/1994 | Loy | |
| 5,364,797 A | 11/1994 | Olson | |
| 5,470,802 A | 11/1995 | Gnade | 437/238 |
| 5,472,913 A | 12/1995 | Havemann | 437/195 |
| 5,494,858 A | 2/1996 | Gnade | 437/231 |
| 5,504,042 A * | 4/1996 | Cho et al. | 437/247 |
| 5,523,615 A | 6/1996 | Cho | |
| 5,561,318 A | 10/1996 | Gnade | 257/638 |
| 5,565,142 A | 10/1996 | Deshopande | 427/220 |
| 5,622,684 A | 4/1997 | Pinnavaia | 423/700 |
| 5,625,108 A | 4/1997 | Perego | |
| 5,647,962 A | 7/1997 | Jansen | |
| 5,661,344 A | 8/1997 | Havemann | 257/758 |
| 5,723,368 A | 3/1998 | Cho | |
| 5,736,425 A | 4/1998 | Smith | |
| 5,753,305 A | 5/1998 | Smith | |
| 5,789,819 A | 8/1998 | Gnade | 257/259 |
| 5,795,556 A | 8/1998 | Jansen | 423/338 |
| 5,795,559 A | 8/1998 | Pinnavaia | 423/702 |
| 5,800,799 A | 9/1998 | Pinnavaia | |
| 5,804,508 A | 9/1998 | Gnade | 438/778 |
| 5,807,607 A | 9/1998 | Smith | |
| 5,840,271 A | 11/1998 | Carrazza | 423/700 |
| 5,847,443 A | 12/1998 | Cho | 257/632 |
| 5,851,715 A * | 12/1998 | Barthel et al. | 423/335 |
| 5,858,457 A | 1/1999 | Brinker et al. | 427/162 |
| 5,922,299 A | 7/1999 | Bruinsma | |

OTHER PUBLICATIONS

Qisheng Huo, David Margolese, Ilike Ciesla, Dirl G. Demouth, Pingyun Feng, Thrumand E. Gier, Peter Sieger, Ali Firouzi, Brady F. Chmelka, Ferdi Schuth and Galen D. Stucky, Organization of Organic Molecules with Inorganic Molecular Species into Nanocomposite Biphase Arrays, Chem, Mater. 1994, 6:1176–1191 (No month avail.).

Hong Yang, Neil Cooms, Igor Sokolov and Geoffrey A. Ozin, Free–standing and Oriented Mesoporous Silica Films Grown at the Air–Water Interface, Nature, vol. 381, Jun. 13, 1996, pp. 589–592.

Chemical Abstracts, vol. 52:798e.

* cited by examiner

*Primary Examiner*—Stuart L. Hendrickson
(74) *Attorney, Agent, or Firm*—Marger Johnson & McCollom, P.C.

(57) ABSTRACT

The present invention is a method of dehydroxylating a silica surface that is hydroxylated having the steps of exposing the silica surface separately to a silicon organic compound and a dehydroxylating gas. Exposure to the silicon organic compound can be in liquid, gas or solution phase, and exposure to a dehydroxylating gas is typically at elevated temperatures. In one embodiment, the improvement of the dehydroxylation procedure is the repetition of the soaking and dehydroxylating gas exposure. In another embodiment, the improvement is the use of an inert gas that is substantially free of hydrogen. In yet another embodiment, the present invention is the combination of the two-step dehydroxylation method with a surfactant templating method of making a mesoporous film.

25 Claims, 4 Drawing Sheets

METHOD OF DEHYDROXYLATING A HYDROXYLATED MATERIAL AND METHOD OF MAKING A MESOPOROUS FILM

This invention was made with Government support under Contract DE-AC0676RLO1830 awarded by the U.S. Department of Energy. The Government has certain rights in the invention.

FIELD OF THE INVENTION

The present invention relates generally to obtaining a silica film with a low dielectric constant that is stable over time with improved methods of dehydroxylation of hydroxylated silica film.

As used herein, the term "silica" means a compound having silicon (Si) and oxygen (O), and possibly additional elements.

Further, as used herein, "mesoporous" refers to a size range which is greater than 1 nanometer, but significantly less than a micrometer.

BACKGROUND OF THE INVENTION

Porous silica films are potentially useful as low dielectric constant intermetal materials in semiconductor devices, as low dielectric constant coatings on fibers and other structures, and in catalytic supports.

Most of the U.S. semiconductor industry has successfully implemented the use of interlevel dielectric films with dielectric constant (k') in the range of 2.6 to 3.0. Further reductions in dielectric constant could improve the operating speed of semiconductor devices and reduce overall device cost by decreasing the number of metallization levels that are required.

Porous silica films with nanometer-scale porosity that are produced from solution precursors may be classified into two types (1) "aerogel or xerogel" films in which a random porosity is introduced by controlled removal of an alcohol-type solvent, and (2) "mesoporous" surfactant-templated films in which the pores are formed by removal of the surfactant. The formation of "mesoporous" films is based on the principle of using surfactants to template mesoporosity. In the surfactant-templated films, the pores either form ordered (e.g. hexagonal) arrays or disordered structures, with the characteristic pore diameter being defined by the surfactant micelle size. "Mesoporous" refers to a size range which is greater than 1 nm, but significantly less than a micrometer. In general, this refers most often to a size range from just over 1.0 nm (10 angstroms) to a few tens of nanometers.

In order to obtain low dielectric constant in highly porous silica films it is necessary to minimize the number of hydroxyl groups in the structure, especially at pore surfaces. Without dehydroxylation, the dielectric constant of porous silica films can exceed to a considerable extent, that of dense silica (i.e. approximately 4.0).

Porous silica materials need to be treated at very high temperatures of over 800° C. in order to obtain silica surfaces that are highly dehydroxylated. For microelectronic applications, semiconductor devices with dielectric films and metal lines cannot usually be processed over about 500° C. Thus, porous silica films such as mesoporous films used in microelectronics are still partially hydroxylated after heat treatment in the temperature range of 450° C. to 500° C.

E. F. Vansant, P. Van der Voort and K. C. Vrancken, in *Characterization and Chemical Modification of the Silica Surface,* Vol. 93 of Studies in Surface Science and Catalysis, Elsevier, New York, N.Y. (1995), and C. J. Brinker and G. W. Scherer, in *Sol-Gel Science,* Academic Press, New York, N.Y. (1990), have reviewed dehydroxylation of silica surfaces by fluorination or by treatment with silane solutions. Furthermore, low dielectric constants in aerogel-type films have been demonstrated by both (a) fluorination treatment, and (b) a two-step dehydroxylation method of (1) initial silane solution treatment (e.g. trimethylchlorosilane or hex-amethyidisilazane (HMDS) in a solvent), and then (2) following this solution treatment with a treatment in hydrogen-containing gases (e.g. 10% hydrogen in nitrogen) at moderately high temperatures of 300–450° C. The silane/forming gas($H_2$ in $N_2$) treatment is discussed in U.S. Pat. No. 5,504,042 and some of the other related patents by Smith and colleagues that are referenced therein.

Heretofore, the most successful demonstration of low dielectric constant films with dielectric constant of 2.5 or less has been with aerogel type porous silica films. However, the smallest average pore diameter typically possible in spin coated aerogel films falls in the size range of 10–100 nm. Also, low dielectric constant mesoporous films prepared from solutions must be prepared by techniques such as spin coating which can be used in a manufacturing process line. Over large-area circular wafers, other coating techniques such as dip coating are not as convenient as spin-coating, and uniform film thickness by dip coating over the entire wafer is difficult and has not been reported in prior literature for either dip coating or spin coating.

Although dehydroxylation of silica films, especially porous silica films made by the aerogel process has been reported to achieve low dielectric constants, there is still a need for yet lower dielectric constant films.

Hence, there is a need for a mesoporous film having a low dielectric constant that is stable over time.

SUMMARY OF THE INVENTION

It is therefore an object of the present invention to provide a method of dehydroxylating a silica surface that is hydroxylated in order to obtain a low dielectric constant.

It is further an object of the present invention to provide methods of making mesoporous silica film, which result in low dielectric constant and permit spin-coating techniques that do not require atmosphere controls. These methods of making mesoporous silica film further provide for superior control of film thickness and average pore diameter smaller than 5 nm. The present invention differs from the aerogel method through the use of specific surfactant molecules to template porosity in spin-coated films.

The present invention is a method of dehydroxylating a silica surface that is hydroxylated having the steps of exposing the silica surface separately to a silicon organic compound and a dehydroxylating gas. The silicon organic compound is also known as a silylation agent. Exposure to the silicon organic compound can be in liquid, gas or solution phase, and exposure to a dehydroxylating gas is typically at elevated temperatures. The present invention has the advantages of providing a mesoporous film of a silica material having low dielectric constant that is stable over time. Further advantages of the present invention potentially include improved safety and lower cost when applied on a large scale.

In one embodiment, the improvement of the dehydroxylation procedure is the repetition of the soaking and dehydroxylating gas exposure. In another embodiment, the improvement is the use of an inert gas that is substantially free of hydrogen.

In yet another embodiment, the present invention is the combination of the two-step dehydroxylation method with a surfactant templating method of making a mesoporous film. The method of making a mesoporous silica film has the general steps as described in U.S. Pat. No. 5,922,299 hereby incorporated by reference, viz: combining a surfactant in a silica precursor solution, spin-coating a film, and heating the film to remove the surfactant to form a mesoporous film that is at least partially hydroxylated, and dehydroxylating the hydroxylated film to obtain the mesoporous film. According to the present invention, the improvement comprises dehydroxylation of the hydroxylated film with the two-step dehydroxylation of exposing the hydroxylated film separately to a silicon organic compound and to a dehydroxylating gas to obtain a mesoporous film with low dielectric constant.

Further improvements are realized for any of the above referenced embodiments by using a polyoxyethylene ether compound as the surfactant.

It is advantageous that the small polyoxyethylene ether surfactants used in spin-coated films as described in the present invention will result in fine pores smaller than about 5 nm. Most often the average pore diameter can be tailored with surfactants in the size range from about 2 to about 5 nm. This average pore diameter range is desirable in interlevel dielectric films that separate metallization lines in semiconductor devices to minimize diffusion of metal species during repeated heat treatments. These small polyoxyethylene ether surfactants are different from large polyalkylene oxide "block co-polymer" surfactants used to make fibers with pores larger than 5 nm. Further advantages of the present invention include a method which provides for superior control of film thickness and thickness uniformity across a coated wafer, films with low dielectric constant, and spin-coating techniques which do not require atmosphere controls.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DESCRIPTION OF THE PREFERRED EMBODIMENT(S)

Figure 1:
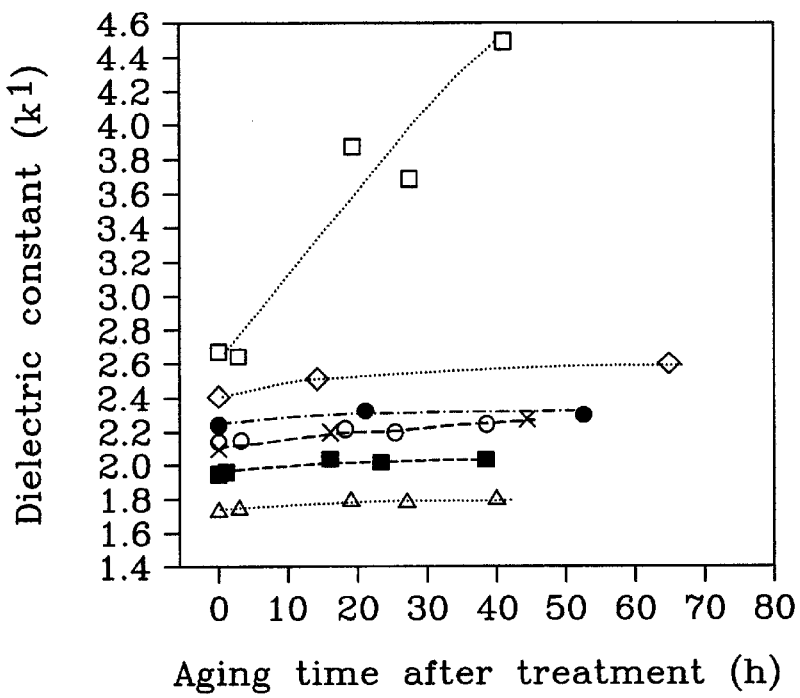
FIG. 1 is a graph of dielectric constant versus time for various mesoporous materials.

The present invention is improvements to the two-step method of dehydroxylating a silica surface that is hydroxylated. The basic two-step method of dehydroxylation has the steps of exposing the silica surface separately (1) to a silicon organic compound and (2) to a dehydroxylating gas.

The improvements of the present invention are (a) repeating the basic two-step method and achieving a dielectric constant less than 2.25; (b) using an inert gas substantially free of hydrogen as the dehydroxylating gas and achieving a safer dehydroxylation method; (c) combining the two-step method with surfactant templating method of making mesoporous films, and (d) combinations thereof.

A hydroxylated film is dehydroxylated by exposing the hydroxylated film separately to a silicon organic compound, preferably a silane, and to a dehydroxylating gas. The exposure to a silane may be as a silane vapor, silane liquid, silane solution or combination thereof. In a silane solution, the solvent is preferably non-aqueous, for example toluene. The silane may be trimethylchlorosilane, hexamethyl disilazane or combinations thereof. The exposure to the dehydroxylating gas is preferably at an elevated temperature. The dehydroxylating gas may be an inert gas or a mixture of an inert gas containing hydrogen. The inert gas is substantially free of hydrogen which is defined herein as either having no hydrogen or an amount of hydrogen that is ineffective in the dehydroxylation. An amount of hydrogen below detectable limits is practically ineffective for the dehydroxylation.

Dehydroxylation of polyoxyethylene ether surfactant-based films is a preferred embodiment. However, lower dielectric constants by such dehydroxylation procedures are also obtainable on films prepared with other surfactants including but not limited to ammonium (CTAC) surfactant-based films.

EXAMPLE 1

In the examples reported here, $C_{12}H_{25}$ $(CH_2CH_2O)_{10}OH$ (also known as $C_{12}EO_{10}$ or 10 lauryl ether) was used as the surfactant to introduce porosity in the film. Data was also obtained on films prepared with another surfactant, $C_{16}H_{33}$ $(CH_2CH_2O)_{10}OH$ (also known as $C_{16}EO_{10}$ or 10 cetyl ether) of the same family using some of the dehydroxylation treatments reported below.

All the films were prepared using a solution with the following molar ratios: TEOS:$H_2O$:ethanol:hydrochloric acid=1:5:5:0.05. The surfactant/TEOS mole ratio was 0.17. All the components except for the TEOS were mixed until a clear homogeneous solution was obtained, and then TEOS was added and the solution was stirred. Following addition of TEOS, the solution was aged for ~20 h at room temperature and then spin-coated on polished 4-inch Si wafers. After spin-coating, the film was then kept at 115° C. for at least 1 hour to complete drying and increase condensation of the silica, and was later calcined at 475° C. for 5 hours.

The calcined films were subjected to one or more of the following dehydroxylation treatments:

a) immersed in 10% solution of HMDS in toluene for 20–24 hours, and then sonicated in isopropyl alcohol and dried in flowing nitrogen at room temperature. This procedure is hereafter referred to as "HMDS (L)"

b) heat treated at 400° C. for 2 hours in flowing 2%H2-98%N2 gas. This procedure hereafter referred to as "2%H2"

c) heat treated at 400° C. for 2 hours in flowing argon. This procedure hereafter referred to as "Ar"

d) film flooded with pure HMDS for 15 seconds, spun to 2000 rpm, and then film flooded with isopropyl alcohol for 15 seconds, and then spun at 2000 rpm.

The capacitance measurement was performed as follows. After film deposition and treatment, the backside of the wafer was scratched/etched to expose bare silicon surface and a layer of gold was then sputter-deposited. On the top film side, an array of gold dots approximately 2.8 mm in diameter was formed by sputtering using a shadow mask. Capacitance was measured for four dots on each sample, and the dielectric constant calculated using the film thickness and dot diameter.

The average dielectric constants obtained in this manner are shown in Table E1-1. For some of the samples that received a final heat treatment in hydrogen-containing gas or argon, the samples were first electroded with gold prior to the final heat treatment. The capacitance was measured before and after the heat treatment. Table I also lists contact angle of water droplets on films after some treatments.

TABLE E1-1

Effect of Dehydroxylation Treatment on Dielectric Constant of Mesoporous Silica Films Prepared with $C_{12}EO_{10}$ Polyoxyethylene Ether Surfactant

| Description of Dehydroxylation Procedure | Sample ID | Water Contact Angle - "Measure of Hydrophobicity" | Dielectric Constant |
|---|---|---|---|
| 2% H2 | 103-2-1-B1 | 12° | 2.67 |
| HMDS (L) | XL-92-2 | | 3.34 |
| HMDS (L) >> 2% H2 | XL-92-2 | | 2.41 |
| HMDS(L) >> 2% H2 >> HMDS(L) | 103-2-1-A1 | 75° | 2.14 |
| | 112-1-III-D1 | | 2.56 |
| HMDS(L) >> 2% H2 >> HMDS(L) >> 2% H2 | 103-2-1-A2 | 72° | 1.74 |
| | 112-1-III-D1 | | 2.12 |
| HMDS(L) >> Ar | 103-2-1-B2 | 42° | 1.95 |
| HMDS(L) >> Ar >> HMDS(L) | 112-1-III-D2 | | 2.55 |
| HMDS(L) >> Ar >> HMDS(L) >> Ar | 112-1-III-D2 | | 2.24 |
| HMDS spin coat >> 2% H2 >> HMDS spin coat | 103-2-1-C1 | | 2.48 |
| HMDS spin coat >> 2% H2 >> HMDS spin coat >> 2% H2 | 103-2-1-C1 | | 2.10 |

From the data in Table E1-I, two conclusions can be drawn. First, compared to untreated silica films, all the treatments result in low dielectric constants in the film. Second, dielectric constants of ~2.50 can be obtained after treatment in the silane solution followed by treatment in an inert gas or a hydrogen-containing gas at moderately elevated temperatures. In one film (103-2-1A2), a dielectric constant as low as 1.74 was obtained after two treatments in the silane and two treatments in 2%H2/N2. In another film (103-2-1-B2), a dielectric constant as low as 1.95 was obtained with only a single treatment in the silane solution and one treatment in argon.

For many of the samples listed in Table E1-1, capacitance was also measured as a function of time either immediately after sputter-deposition of the gold electrodes, or immediately after the electroded sample was removed from the furnace after the final heat treatment.

The dielectric constant as a function of aging time for times up to 2–3 days is shown in FIG. 1. Except for the film that received only a treatment in 2%H2 at 400° C. (film #103-2-1-B1), all samples showed excellent stability in capacitance (dielectric constant) with time at room temperature. The ambient relative humidity during the aging measurements was ~40–65%. The low dielectric constants obtained with the films that received treatment(s) in HMDS solution and exposure to dehydroxylating gas heated to about 400° C. are also very stable over very long times, increasing by less than 5% over a week in ambient laboratory conditions with temperature at 20–22° C. and relative humidity of 40–65%. Small changes in the dielectric constant in this aging study appear to correlate well with humidity changes during the experiment. For example, capacitance measured at the highest humidity values was slightly higher than capacitance measured at the lowest humidity values in the experiment.

EXAMPLE 2

A CTAC film was synthesized as in Example 1 except CTAC (cetyl trimethyl ammonium chloride) was used as the surfactant. The CTAC:TEOS ratio was 0.2:1.0. The film was subjected to dehydroxylation by treatment in a hexamethyldisilazane solution and heat treatment in hydrogen-containing nitrogen. Without any dehydroxylation, the capacitance (delectric constant) was high (significantly over 4.0), and unstable and could not be measured. After one treatment in the silane solution and one heat treatment in hydrogen-containing nitrogen, the measured dielectric constant immediately after the heat treatment was 2.38.

Polyoxethylene Ether Surfactant

The embodiments of the present invention may benefit from use of certain surfactants. Thus, included herein is a method of making a mesoporous silica film by spin-coating silica precursor solutions containing a surfactant to form a templated film, heating to form a hydroxylated film, and then dehydroxylating the hydroxylated film to form the mesoporous silica film. These are the same general steps as described in co-pending patent application Ser. No. 08/921, 754, and that application is thus incorporated herein by reference. Therefore, the present invention is a method of making a mesoporous silica film having the steps of combining a surfactant in a silica precursor solution, forming a film by spin-coating, heat treating the film to remove the surfactant and forming a mesoporous film that is hydroxylated, and dehydroxylating the hydroxylated film to obtain the mesoporous film with a low dielectric constant ($\leq 2.5$), wherein, according to the present invention, the improvement comprises using a polyoxyethylene ether surfactant. The term hydroxylated encompasses partially and fully hydroxylated.

The silica precursor solution includes a silica precursor, an aqueous solvent, an acid and a polyoxyethylene ether surfactant. A film is made by spin-coating this silica precursor solution, after which the aqueous solvent, the acid, and the surfactant are removed by heating to form a mesoporous film that is hydroxylated. Dehydroxylating the hydroxylated film results in a mesoporous film with a low dielectric constant. The dehydroxylating is achieved by exposing the hydroxylated film separately to a silicon based organic compound, such as a silane, either as a pure liquid, pure vapor, or as a solution, and a dehydroxylating gas. The resulting mesoporous film has a dielectric constant less than 2.5.

The present invention uses small non-ionic surfactants of the polyoxyethylene ether family of surfactants to template fine pores in spin-coated silica films. The term "non-ionic" refers to a surfactant chemistry where cationic (e.g. ammonium or sodium ions) or anionic (e.g. sulfonate, sulfate or halide) species are not present. The non-ionic surfactants described in this application are small molecules containing carbon, hydrogen and oxygen, with only a hydroxyl (—OH) group at the hydrophilic end of the polymer. With the use of these surfactants, low dielectric constants (i.e. low capacitance in films) are obtained using simple synthesis and processing conditions.

Surfactants in this polyoxyethylene ether family include but are not limited to: (1) $C_{12}H_{25}$ $(CH_2CH_2O)_{10}OH$, also known as $C_{12}EO_{10}$ or 10 lauryl ether; (2) $C_{16}H_{33}$ $(CH_2CH_2O)_{10}OH$, also known as $C_{16}EO_{10}$ or 10 cetyl ether; and (3) $C_{18}H_{37}$ $(CH_2CH_2O)_{10}OH$, also known as $C_{18}EO_{10}$ or 10 stearyl ether, (4) $C_{12}H_{25}(CH_2CH_2O)_4OH$ also known as $C_{12}EO_4$ or 4 lauryl ether, (5) $C_{16}H_{33}$ $(CH_2CH_2O)_2OH$ also known as $C_{16}EO_2$ or 2 cetyl ether, and combinations thereof.

Additionally, a polyoxyethylene ether surfactant may be used in conjunction with other surfactants and smaller hydrophillic molecules compatible with the ethanol and water present in the aqueous solvent, and may also be used in conjuction with organic co-solvents compatible with the surfactant. The surfactants include but are not limited to ammonium-based cationic surfactants such as cetyl trimethyl ammonium chloride (CTAC). The organic co-solvents include but are not limited to mesitylene, octane and combinations thereof. The smaller hydrophilic molecules include but are not limited to glycerol, propylene glycol, ethylene glycol, and combinations thereof. The smaller hydrophilic molecules have much higher boiling points compared to water and ethanol as well as low vapor pressures. These smaller hydrophilic molecules are likely to reside as inclusions in the silica-rich walls that have formed around the surfactant micelles upon spin-coating and drying, thus acting as a pore forming agent, and upon calcination, these inclusions can leave behind finer scale porosity in the silica walls.

The silica precursor solution is preferably made up of tetraethyl orthosilicate (TEOS), ethanol, water, hydrochloric acid, and surfactant. The hydrochloric acid is a catalyst for TEOS hydrolysis. Although a preferable solution mixture contains mole ratios of: TEOS 1.0; water 5; ethanol 5; HCl 0.05; and surfactant 0.17, the surfactant/TEOS mole ratio can be varied to control the pore-volume fraction in the final film and to vary the pore structure. Also, it will be recognized by those skilled in the art that a much wider range of surfactant sizes and amounts in this family of small polyoxyethylene ethers may be possible with different solvent amounts.

A templated film is made by spin-coating the silica precursor solution. The solution is dispensed onto the surface of a substrate and spun using a spin-coater, for example at 2000 rpm for 30 seconds. The substrate is preferably a silicon wafer or an aluminum-coated silicon wafer, but it is not limited to these substrates.

The spin-coating technique used in the present invention requires no atmosphere control when used with these surfactant-containing solutions, and the method should therefore be readily applicable to microelectronics manufacturing. The technique produces films with good thickness uniformity across wafers ranging from small to large surface area. Films produced by the method of the present invention have film thickness from about 0.2 µm to about 1.5 µm with a thickness variation having a standard deviation of less than ±5%. For example, one film with a thickness of about 0.8 µm, had a thickness variation with a standard deviation less than 25 nanometers (3%) across a 4-inch wafer. Other coating techniques such as dip-coating are not as convenient as spin-coating over large-area circular wafers, and uniform film thickness by dip-coating over the entire wafer has not been reported.

After spin-coating, the surfactant-templated film is formed into a hydroxylated mesoporous film by removal of the aqueous solvent, the acid, and the surfactant. Aqueous solvent removal is typically achieved by heating the spin coated film. For example, exposing the spin coated film to a temperature of 115° C. for 1 hour completes drying and increases condensation of the silica. Further heat treatment (calcination) of the film, for example at a temperature of 475° C. for 5 hours, removes the surfactant and forms a mesoporous film that is partially hydroxylated.

EXAMPLE 3

An experiment was conducted to demonstrate the efficacy of a preferred embodiment of the present invention. Three different surfactants in the polyoxyethylene ether family were investigated: (1) $C_{12}H_{25}$ $(CH_2CH_2O)_{10}OH$, also known as $C_{12}EO_{10}$ or 10 lauryl ether; (2) $C_{16}H_{33}$ $(CH_2CH_2O)_{10}OH$, also known as $C_{16}EO_{10}$ or 10 cetyl ether; and (3) $C_{18}H_{37}$ $(CH_2CH_2O)_{10}OH$, also known as $C_{18}EO_{10}$ or 10 stearyl ether. All the films with these surfactants were prepared using a solution with the following molar ratios: TEOS:H2O:ethanol:hydrochloric acid=1:5:5:0.05. The surfactant/TEOS mole ratio was varied from 0.10 to 0.50. All the components except for the TEOS were mixed until a clear homogeneous solution was obtained. TEOS was then added and the solution was stirred. Following addition of TEOS, the solution was aged for 20 hours at room temperature and dispensed onto the surface of polished 4-inch Si wafers by spin-coating at 2000 rpm for 30 seconds using a spin-coater.

The resulting surfactant-templated films were converted to a mesoporous film by removing the aqueous solvent, the acid, and the surfactant. Removal was achieved by subjecting the templated films to a temperature of 115° C. for 1 hour. Complete removal of the surfactant from the films was achieved by calcination (heat treatment) at 475° C. for 5 hours.

Prior to making electrical/capacitance measurements, the calcined films were characterized by nuclear reaction analysis (NRA) to determine porosity and by profilometry to measure thickness. The NRA porosity data was not used as an exact measure of porosity, but rather was used for guidance to help determine which films to select for further electrical/capacitance measurements.

Figure 2:
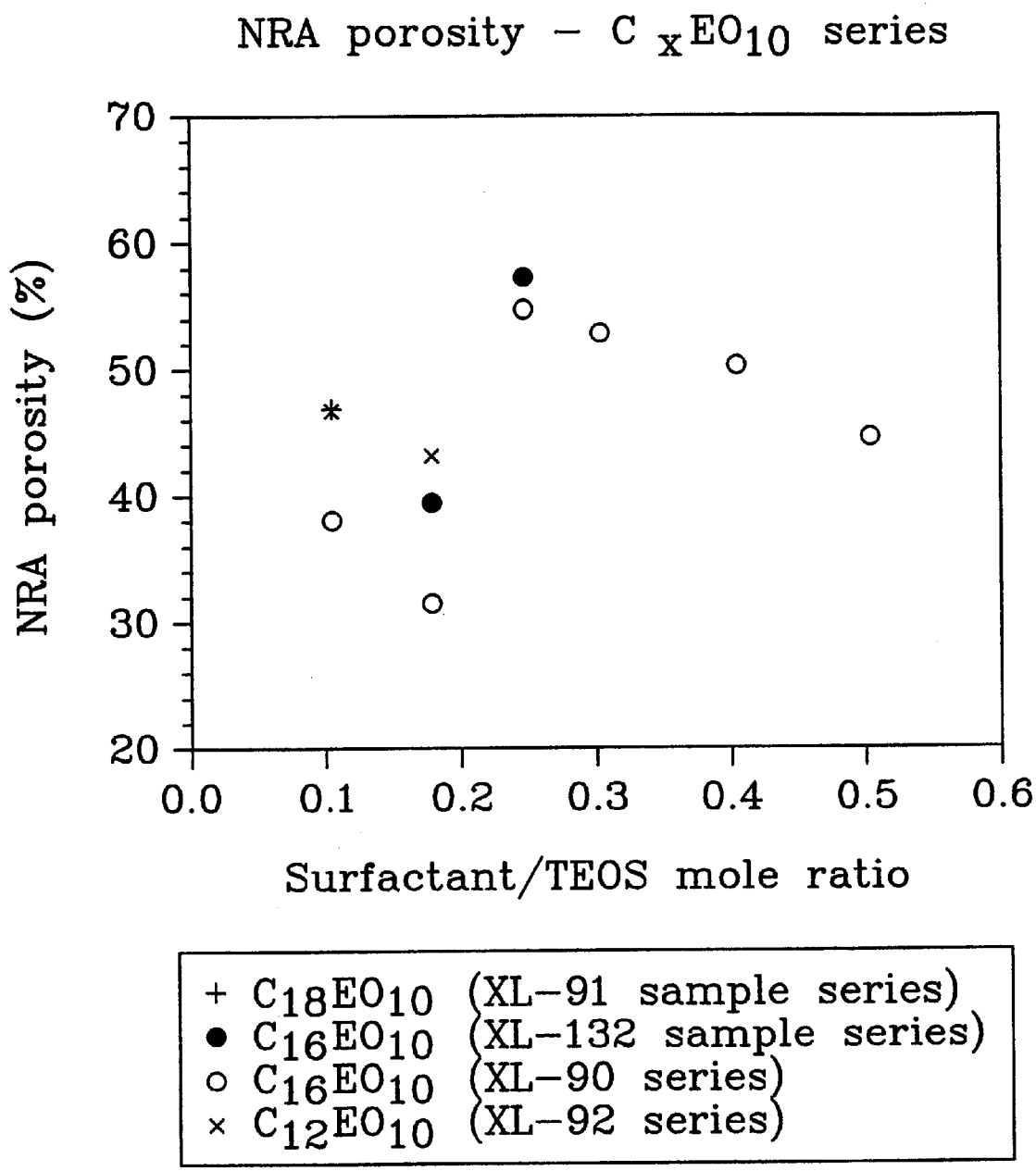
FIG. 2 shows film porosity as a function of surfactant/TEOS mole ratio in a spin-coating solution containing polyoxyethylene ether surfactants as determined by nuclear reaction analysis (NRA) for the $C_xEO_{10}$ polyoxyethylene ether surfactant series.

FIG. 2 shows the porosity determined by NRA for the $C_xEO_{10}$ polyoxyethylene ether surfactant series. The graph shows only porosity values using the different surfactants for only specific surfactant/TEOS values. For several higher surfactant/TEOS ratios the film quality was not acceptable for evaluation of electrical properties, and films formed with such ratios were therefore not electrically investigated. For consideration as dielectric films in semiconductor devices, the film thickness should be in the range of 0.5 to 1.2 μm. In addition, the films should be uniform in thickness, crack-free, and without major blemishes or surface defects. Films with non-wetted islands, cracks, ring-like structures, serrated patterns or cloudy inclusions were not considered for electrical evaluation. Defects such as comets (e.g. due to dust particles on the wafer) on otherwise uniform films were considered acceptable, as these could not be attributed to inherent solution properties. The table E3-1 below lists the observations in terms of film quality with these surfactants at different concentrations.

TABLE E3-1

Film Quality for $C_xEO_{10}$ based Films

| Surfactant>>>> Surfactant/TEOS mole ratio (below) | Film Quality $C_{12}EO_{10}$ | Film Quality $C_{16}EO_{10}$ | Film Quality $C_{18}EO_{10}$ |
| --- | --- | --- | --- |
| 0.10 | Good | Acceptable | Acceptable |
| 0.17 | Good | Poor | Poor |
| 0.24 | Poor | Acceptable | Poor |
| 0.30 | Poor | Acceptable | Poor |
| 0.40 | Poor | Poor | Poor |
| 0.50 | Poor | Poor | Poor |

Based on the NRA porosity data shown in FIG. 2 and the observations concerning film quality, two films were selected for electrical measurements. These two films as shown in Table 1 were those prepared with solutions containing (1) $C_{12}EO_{10}$, surfactant/TEOS mole ratio of 0.17; and (2) $C_{16}EO_{10}$, surfactant/TEOS mole ratio of 0.30.

Initial electrical testing of these calcined films for capacitance using a precision LCR meter yielded dielectric constants (i.e. capacitance) much higher than expected for porous films, because the film still contained a significant amount of hydroxyl (—OH) groups.

Each of these two partially hydroxylated films was therefore dehydroxylated by exposing the hydroxylated film separately to a silane and a dehydroxylating gas. The films were dehydroxylated by treatments of soaking for 24 hours in a 10% solution of hexamethyl disilazane in toluene and exposure for 2 hours to 2% $H_2$ in $N_2$ gas at 400° C. This sequence of dehydroxylation process steps was repeated once on each film, and the dielectric constant was measured after each of these steps.

Figure 4:
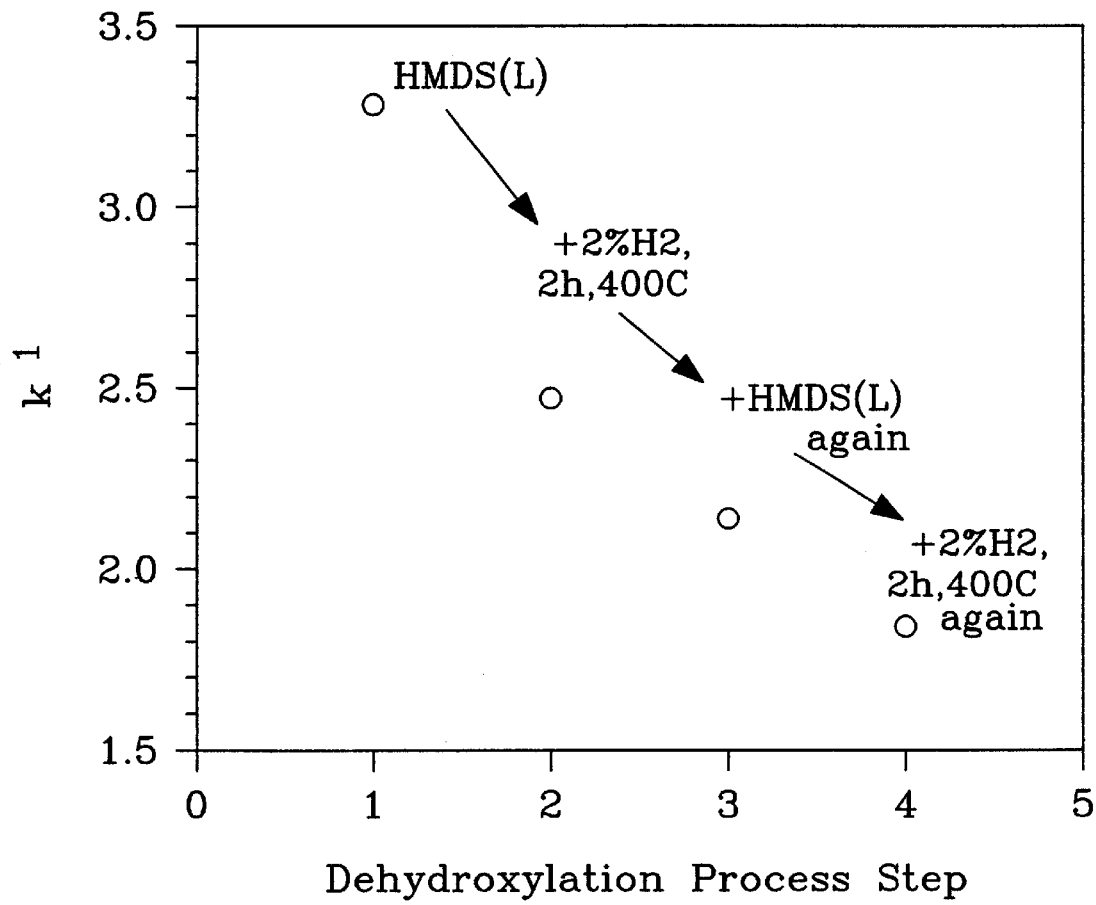
FIG. 4 shows the dielectric constant of a mesoporous silica film prepared with $C_{16}EO_{10}$ polyoxyethylene ether surfactant as a function of dehydroxylation procedures.

The capacitance measurements were performed as follows. The backside of the wafer was scratched/etched to expose bare silicon surface and a layer of gold was then sputter-deposited. On the top film side, an array of gold dots approximately 2.8 mm in diameter was formed by sputtering using a shadow mask. Capacitance was measured for four dots on each sample, and the dielectric constant was calculated using the film thickness and dot diameter. The dielectric constant data obtained in this way is shown in FIG. 2 and FIG. 4 for the two different films.

Figure 3:
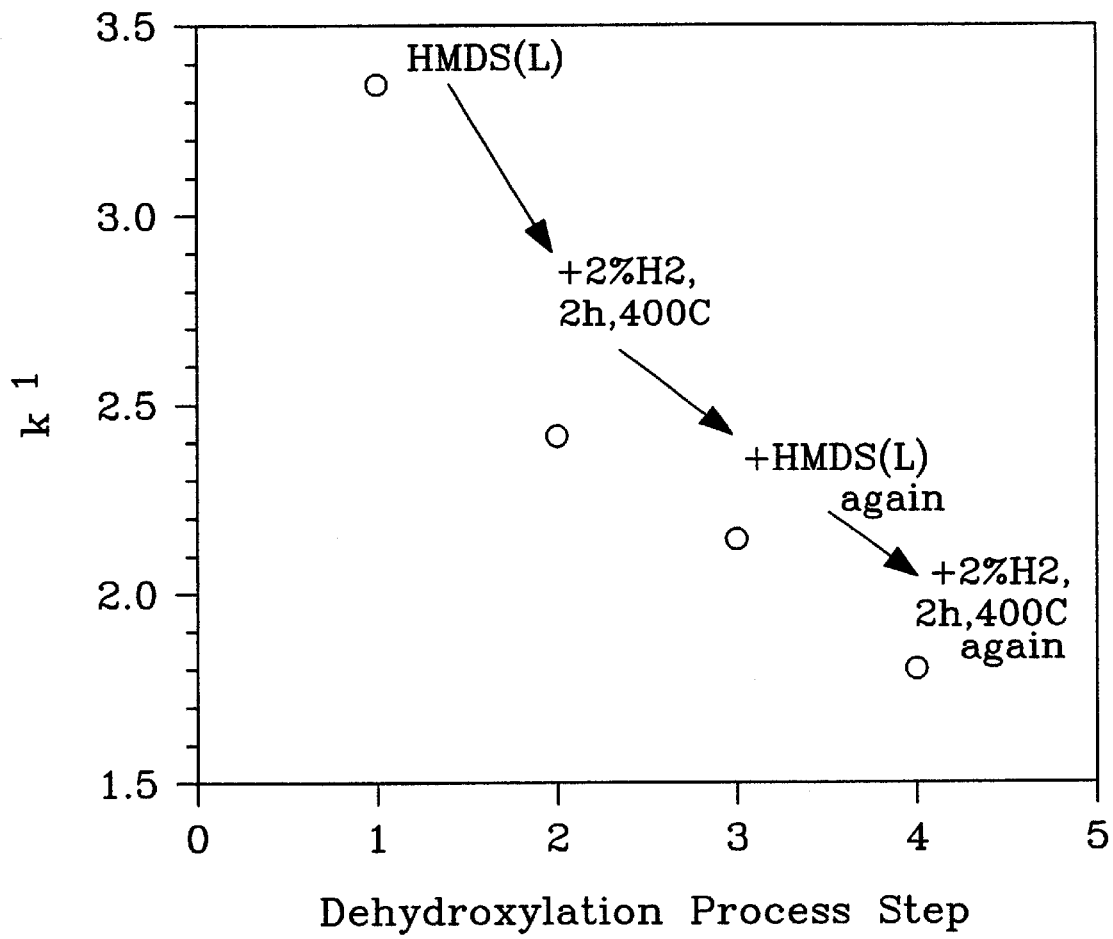
FIG. 3 shows the dielectric constant of a mesoporous silica film prepared with $C_{12}EO_{10}$ polyoxyethylene ether surfactant as a function of dehydroxylation procedures.

The data in FIG. 3 shows that a dielectric constant of 1.80 can be obtained for the film synthesized with the $C_{12}EO_{10}$ surfactant. The data in FIG. 4 shows that a dielectric constant of 1.85 can be obtained for the film synthesized with the $C_{16}EO_{10}$ surfactant. Such low dielectric constants indicate tremendous promise for application of such mesoporous silica films prepared with small polyoxyethylene ether surfactants in semiconductor devices. The low dielectric constants obtained with these films are also very stable, increasing by less than 5% over a period of one day in ambient laboratory conditions with temperatures at 20–22° C. and a relative humidity of 40–65%. The dielectric constants did not increase in value thereafter.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method of dehydroxylating a hydroxylated surfactant-templated mesoporous silica surface wherein the molecular structure of the surfactant dictates the arrangement and size of pores within the mesoporous silica surface, comprising the steps of:

(a) exposing the hydroxylated, surfactant-templated mesoporous silica surface to a silicon organic compound;

(b) exposing the hydroxylated, surfactant-templated mesoporous silica surface to a dehydroxylating gas;

(c) repeating steps (a) and (b) at least once, thereby iteratively dehydroxylating the surfactant-templated mesoporous silica surface to achieve a dielectric constant less than 2.25.

2. The method as recited in claim 1, wherein said silicon organic compound is in non-aqueous solution comprising said silicon organic compound and a solvent.

3. The method as recited in claim 2, wherein said silicon organic compound is a silane selected from the group consisting of trimethylchlorosilane, hexamethyl disilazane and combinations thereof.

4. The method as recited in claim 1, wherein said exposing the hydroxylated, surfactant-templated mesoporous silica surface to said silicon organic compound comprises soaking said silica surface in a solution containing said silicon organic compound.

5. The method as recited in claim 1, wherein said dehydroxylating gas is an inert gas.

6. The method as recited in claim 5, wherein said inert gas is argon.

7. The method as recited in claim 5, wherein said inert gas is nitrogen.

8. The method as recited in claim 1, wherein said dehydroxylating gas includes hydrogen.

9. The method as recited in claim 1, wherein said exposing the hydroxylated, surfactant-templated mesoporous silica surface to a dehydroxylating gas includes heating the hydroxylated surfactant-templated mesoporous silica surface and said dehydroxylating gas to an elevated temperature.

10. The method as recited in claim 1, wherein said exposing the hydroxylated, surfactant-templated mesoporous silica surface to said silicon organic compound is a first step followed by said exposing the hydroxylated, surfactant-templated mesoporous silica surface to said dehydroxylating gas as a second step.

11. The method as recited in claim 1, wherein said exposing the hydroxylated, surfactant-templated mesoporous silica surface to said dehydroxylating gas is a first step followed by said exposing the hydroxylated, surfactant-templated mesoporous silica surface to said silicon organic compound as a second step.

12. A method of dehydroxylating a silica surface that is hydroxylated, comprising the steps of:
(a) exposing said silica surface to a silicon organic compound, wherein said silicon organic compound is in non-aqueous solution comprising said silicon organic compound and a solvent and wherein said solvent is toluene;
(b) exposing said silica surface to a dehydroxylating gas; and
(c) repeating steps (a) and (b), thereby achieving a dielectric constant less than 2.25.

13. A method of dehydroxylating a silica surface that is hydroxylated, comprising the steps of:
(a) exposing said silica surface to a silicon organic compound;
(b) exposing said silica surface to a dehydroxylating gas, wherein said dehydroxylating gas includes hydrogen and wherein said hydrogen is in an amount of about 2 wt %;
(c) repeating steps (a) and (b), thereby achieving a dielectric constant less than 2.25.

14. A method of dehydroxylating a silica surface that is hydroxylated, comprising the steps of:
(a) exposing said silica surface to a silicon organic compound in a solvent, and
(b) exposing said silica surface to a dehydroxylating gas, wherein said dehydroxylating gas is an inert gas that is substantially free of hydrogen, thereby achieving a dielectric constant less than 2.25 that is stable over time.

15. The method of claim 14, wherein the achieved dielectric constant of less than 2.25 increases by no more than approximately 20 percent over approximately 2–3 days under ambient conditions at approximately 40–65% relative humidity.

16. The method of claim 15, wherein the achieved dielectric constant of less than 2.25 increases by no more than approximately 5 percent over approximately one week under ambient conditions at approximately 40–65% relatively humidity.

17. The method as recited in claim 14, further comprising repeating step (a) thereby obtaining a dielectric constant less than 2.25.

18. The method as recited in claim 14, wherein said silicon organic compound is a silane is selected from the group consisting of trimethylchlorosilane, hexamethyl disilazane and combinations thereof.

19. The method as recited in claim 14, wherein said solvent is toluene.

20. The method as recited in claim 14, wherein said exposing said silica surface separately to said silicon organic compound comprises soaking said silica surface in a solution containing said silicon organic compound.

21. The method as recited in claim 14, wherein said inert gas is argon.

22. The method as recited in claim 14, wherein said exposing said silica surface separately to a dehydroxylating gas includes heating said silica surface and said dehydroxylating gas to an elevated temperature.

23. The method as recited in claim 14, wherein said exposing said silica surface to said dehydroxylating gas is a first step followed by said exposing said silicon organic compound to said liquid non-aqueous solution as a second step.

24. The method as recited in claim 14, wherein said exposing said silica surface to said silicon organic compound is a first step followed by said exposing said silica surface to said dehydroxylating gas as a second step.

25. The method as recited in claim 24, wherein said first and second steps are repeated.

* * * * *